United States Patent
Long et al.

(10) Patent No.: US 10,672,590 B2
(45) Date of Patent: Jun. 2, 2020

(54) FREQUENCY TUNING FOR A MATCHLESS PLASMA SOURCE

(71) Applicant: Lam Research Corporation, Fremont, CA (US)

(72) Inventors: Maolin Long, Santa Clara, CA (US); Yuhou Wang, Fremont, CA (US); Ying Wu, Dublin, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/921,266

(22) Filed: Mar. 14, 2018

(65) Prior Publication Data

US 2019/0287764 A1   Sep. 19, 2019

(51) Int. Cl.
*H01J 37/32* (2006.01)

(52) U.S. Cl.
CPC ...... *H01J 37/32155* (2013.01); *H01J 37/321* (2013.01); *H01J 2237/334* (2013.01); *H01J 2237/3321* (2013.01)

(58) Field of Classification Search
CPC .......................... H01J 37/32155; H01J 37/321
See application file for complete search history.

(56) References Cited

U.S. PATENT DOCUMENTS

| | | | |
|---|---|---|---|
| 6,252,354 B1 | 6/2001 | Collins et al. | |
| 6,887,339 B1 | 5/2005 | Goodman et al. | |
| 10,264,663 B1* | 4/2019 | Long | H01J 37/32174 |
| 2007/0159107 A1* | 7/2007 | Powell | H05B 41/38 |
| | | | 315/149 |
| 2011/0115379 A1 | 5/2011 | Long et al. | |
| 2012/0153829 A1* | 6/2012 | Schuermann | H05H 1/46 |
| | | | 315/111.21 |
| 2017/0159711 A1 | 6/2017 | Matsumoto | |
| 2017/0250056 A1 | 8/2017 | Boswell et al. | |
| 2018/0315581 A1* | 11/2018 | Hayami | H01L 21/3065 |

OTHER PUBLICATIONS

ISR PCT/US2019/021172, dated Jun. 17, 2019, 8 pages.

* cited by examiner

*Primary Examiner* — Renan Luque
*Assistant Examiner* — Jianzi Chen
(74) *Attorney, Agent, or Firm* — Penilla IP, APC

(57) ABSTRACT

Frequency tuning for a matchless plasma source is described. To perform the frequency tuning, current is measured at an output of an amplification circuit of the matchless plasma source after a change in a frequency of operation of the matchless plasma source. Upon determining that the current has increased with the change in the frequency of operation, the frequency of operation is further changed until the current has decreased. When the current has decreased, the changed frequency of operation is further modified to be an operational frequency. When the matchless plasma source operates at the operational frequency, the current at the output of the amplification circuit is maximized.

15 Claims, 5 Drawing Sheets

FREQUENCY TUNING FOR A MATCHLESS PLASMA SOURCE

FIELD

The present embodiments relate to frequency tuning for a matchless plasma source.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A traditional plasma tool includes a radio frequency (RF) generator, an impedance matching circuit, and a plasma chamber. The RF generator is connected to the impedance matching circuit, which is further connected to the plasma chamber. The RF generator generates RF power that is supplied to the impedance matching circuit. The impedance matching circuit matches an impedance of the plasma chamber with that of the RF generator.

During processing of the wafer, various parameters associated with the plasma tool are controlled. It is in this context that embodiments described in the present disclosure arise.

SUMMARY

Embodiments of the disclosure provide systems, apparatus, methods and computer programs for frequency tuning of a matchless plasma source (MPS). It should be appreciated that the present embodiments can be implemented in numerous ways, e.g., a process, or an apparatus, or a system, or a piece of hardware, or a method, or a computer-readable medium. Several embodiments are described below.

In radio frequency (RF) generators of the matchless plasma source (MPS), a traditional RF matching network that matches a plasma chamber impedance to a 50 ohm output impedance of a traditional RF generator is eliminated by frequency tuning in the matchless plasma source that has a substantially low output resistance and sees a pure resistive load when the matchless plasma source is tuned.

In some systems, frequency tuning is performed by a measurement of a phase angle between a voltage waveform and a current waveform. The frequency tuning stops when the phase angle is driven to zero or within a pre-set range from zero. However, it is difficult to measure the phase angle accurately. Also, the phase angle of zero or within the preset range from zero is difficult to achieve because of oscillations in the voltage waveform. As such, the frequency tuning based on the phase angle becomes difficult.

In some embodiments, a method for optimizing power output of a matchless plasma source including a signal generator is described. The method includes controlling the signal generator to operate at an operating frequency to generate a pulsed signal that is used to produce a sinusoidal current waveform. The method further includes measuring a magnitude of current of the sinusoidal current waveform and adjusting the operating frequency while continuing to measure the magnitude of current. The method includes identifying a target frequency that generates an approximate maximum magnitude of current during the adjusting.

In various embodiments, a system for optimizing power output of a matchless plasma source is described. The system includes a signal generator, a gate driver circuit coupled to the signal generator, an amplification circuit coupled to the gate driver circuit, and a controller coupled to the signal generator. The controller is configured to control the signal generator to operate at an operating frequency to generate a pulsed signal that is used to produce a sinusoidal current waveform. The system further includes a current probe coupled to an output of the amplification circuit. The current probe is configured to measure a magnitude of current of the sinusoidal current waveform. The controller is configured to adjust the operating frequency while the magnitude of current is measured. The controller is configured to identify a target frequency that generates an approximate maximum magnitude of current during the adjustment of the operating frequency.

In several embodiments, a controller for optimizing power output of a matchless plasma source including a signal generator is described. The controller includes a processor configured to control the signal generator to operate at an operating frequency to generate a pulsed signal that is used to produce a sinusoidal current waveform. The processor is configured to receive a magnitude of current of the sinusoidal current waveform. The processor is configured to adjust the operating frequency while the magnitude of current is measured. The processor is configured to identify a target frequency that generates an approximate maximum magnitude of current during the adjustment of the operating frequency. The controller includes a memory device coupled to the processor. The memory device is configured to store the target frequency.

Some advantages of the herein described systems and methods for frequency tuning of the matchless plasma source include tuning an operating frequency of the signal generator to achieve an approximate maximum magnitude of a complex current at an output of the matchless plasma source. There is no need to determine a phase difference between the complex current and a complex voltage at the output of the matchless plasma source. The determination of the phase difference depends on different conditions of a plasma chamber. Each time a condition of the plasma chamber changes, the phase difference is measured and it is determined whether the phase difference is substantially zero, such as zero or within a pre-set range from zero. In some embodiments, there is no need to measure a magnitude of the complex current at the output and to determine whether the magnitude is the approximate maximum magnitude for each change in the condition of the plasma chamber.

Moreover, tuning the operating frequency based on a magnitude of the complex current is more reliable compared to tuning the operating frequency based on the phase difference. The voltage waveform at the output of the matchless plasma source has oscillations, and therefore, it is difficult to determine values of the operating frequency for which the phase difference is substantially zero. Comparatively, a processor of a controller is able to determine the operating frequency for which a magnitude of the complex current at the output of the matchless plasma source is the approximate maximum. There are none or negligible oscillations in a current waveform of the complex current at the output at the output of the matchless plasma source.

Other advantages of the herein described systems and methods for frequency tuning of the matchless plasma source include using a simpler hardware design compared to that used for determining the phase difference. The simpler hardware design includes a current probe that measures a magnitude of the complex current at the output of the matchless plasma source. There is no need to use a complex voltage and current sensor to measure the phase difference or a voltage sensor to facilitate measurement of the phase difference. The voltage sensor measures voltage values of the voltage waveform at the output of the matchless plasma source. The current probe measures current values of the complex current. When the voltage sensor is used, the phase difference is determined between the complex current and the voltage waveform. In addition to being simpler, the current probe is substantially less costly compared to the complex voltage and current sensor or the complex voltage sensor that is designed to measure a phase angle between the voltage and the current.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe frequency tuning systems and methods for a matchless plasma source (MPS). It will be apparent that the present embodiments may be practiced without some or all of these specific details. In other instances, well known process operations have not been described in detail in order not to unnecessarily obscure the present embodiments.

The frequency tuning systems and methods include a current probe that is coupled to an output of the matchless plasma source. The current probe measures a magnitude of a complex current at the output of the matchless plasma source and provides the magnitude to a controller. The controller determines whether the magnitude is an approximate maximum, which is further described below. If the magnitude is not the approximate maximum, the controller controls a signal generator to change an operating frequency of the signal generator. The change in the operating frequency changes the magnitude of the complex current at the output. The current probe again measures the changed magnitude of the complex current and provides the changed magnitude to the controller. The controller determines again whether the changed magnitude is the approximate maximum. Upon determining that the changed magnitude is not the approximate maximum, the controller controls the signal generator again to change the operating frequency of the signal generator. On the other hand, upon determining that the changed magnitude of the complex current at the output of the matchless plasma source is the approximate maximum, the controller maintains the operating frequency of the signal generator for which a magnitude of the complex current is the approximate maximum.

Figure 1:
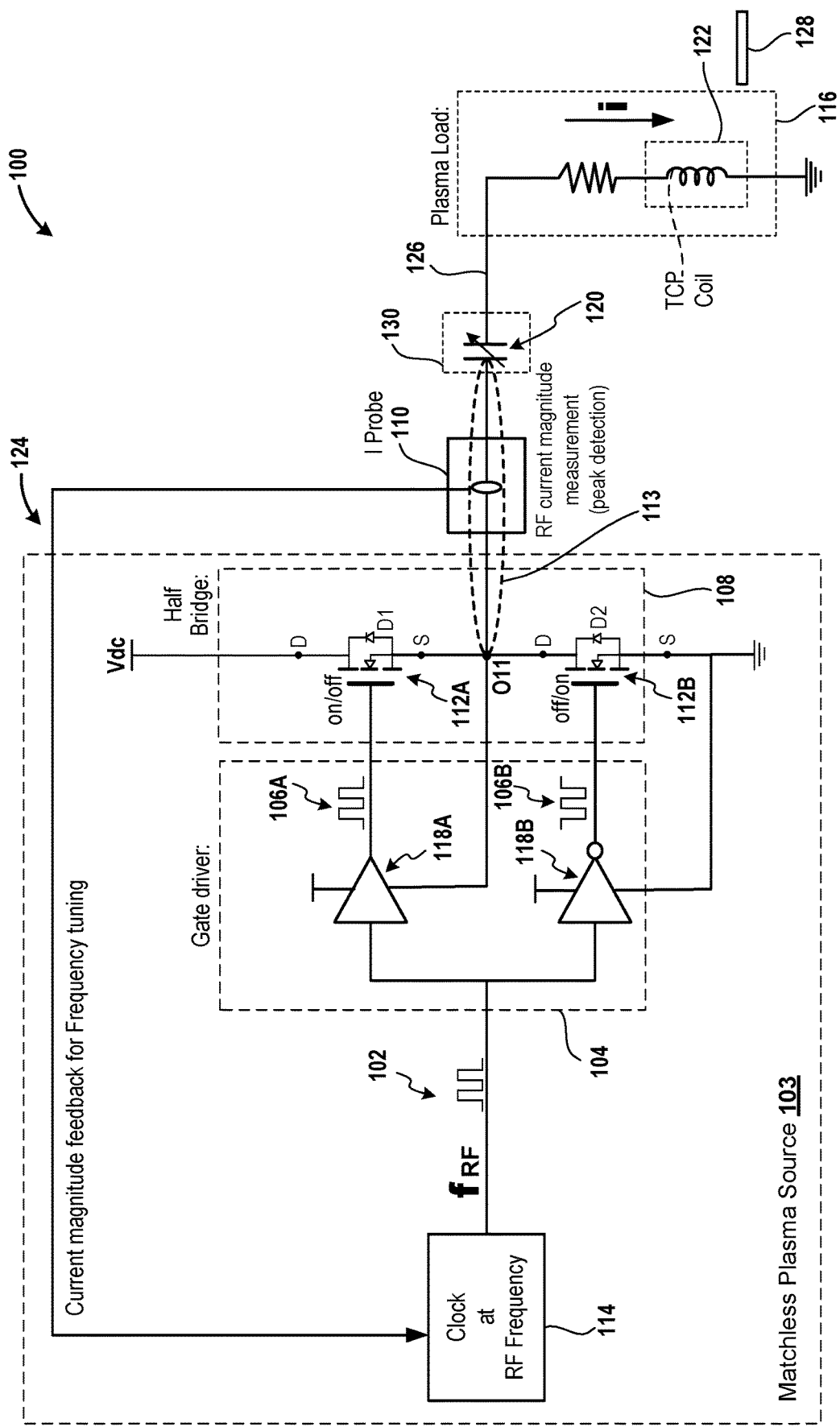
FIG. 1 is a diagram of an embodiment of a system for illustrating a use of a current (I) probe with a matchless plasma source to control an operating frequency of a signal generator.

FIG. 1 is a diagram of an embodiment of a system 100 for illustrating a use of a current (I) probe 110 with a matchless plasma source 103 to control a frequency of a signal generator 114. Various examples of a matchless plasma source, described herein, are provided in a U.S. patent application Ser. No. 15/787,660, titled "Matchless Plasma Source for Semiconductor Wafer Fabrication", and filed on Oct. 18, 2017, which is incorporated by referenced herein in its entirety. The system 100 includes the matchless plasma source 103, which includes a signal generator 114, a gate driver circuit 104, and a half-bridge circuit 108, The system 100 further includes the current probe 110 and a plasma load 116.

An example of the signal generator 114 is a digital clock signal generator that generates a pulsed signal 102, such as a clock signal, at a radio frequency (RF). Another example of the pulsed signal 102 is a square wave signal, such as a digital waveform or a pulse train. The pulsed signal 102 pulses between a first logic level, such as high or one, and a second logic level, such as low or zero. The gate driver circuit 104 includes a gate driver 118A and another gate driver 118B. The gate driver 118A acts as an operational amplifier and the gate driver 118B acts as a NOT gate. The half-bridge circuit 108 includes a transistor 112A and another transistor 112B. Moreover, the half-bridge circuit 108 includes a diode D1 and a diode D2. The diode D1 is coupled between drain D and source S terminals of the transistor 112A and the diode D2 is coupled between drain D and source S terminals of the transistor 112B. An example of the current probe 110 is a current sensor that measures a current, such as a complex current having a magnitude and a phase. The current probe 110 is not a complex voltage and current sensor. For example, the current probe 110 cannot measure a complex voltage at an output O11 of the half-bridge circuit 108 and cannot measure a complex voltage and current at the output O11. The current is measured at the output O11 of the half-bridge circuit 108.

The system 100 further includes a reactive circuit 130 and a plasma load 116. An example of the reactive circuit 130 is a variable capacitor 120. Another example of the reactive circuit 130 is a fixed capacitor. Yet another example of the reactive circuit 130 includes multiple capacitors and/or inductors that are coupled to each other in series, or in parallel, or a combination thereof. Some of the capacitors are variable and the remaining of the capacitors are fixed. As another example, all the capacitors are variable or fixed. Similarly, some of the inductors are variable and the remaining of the inductors are fixed. As another example, all the inductors are variable or fixed.

An example of the plasma load 116 is a transformer coupled plasma (TCP) plasma chamber. The plasma load 116 includes an electrode 122, such as a transformer TCP coil, and plasma when lit. The matchless plasma source 103 is coupled to the electrode 122 via a connection 113, the reactive circuit 130, and a connection 126. An example of a connection, such as the connection 113 or the connection 126, is a conductor, or an RF strap, or a cylinder, or a bridge conductor, or a combination thereof. The connection 113 couples the output O11 to the reactive circuit 130. The plasma load 116 has a resistance, which is represented by a resistor. The connection 126 couples the reactive circuit 130 to the electrode 122 of the plasma load 116.

The signal generator 114 is coupled to an input of the gate driver 118A and is further coupled to an input of the gate driver 118B. Moreover, an output of the gate driver 118A is coupled to an input gate terminal of the transistor 112A and an output of the gate driver 118B is coupled to an input gate terminal of the transistor 112B. The drain terminal D of the transistor 112A is coupled to a direct current (DC) voltage source Vdc and the source terminal S of the transistor 112B is coupled to a ground potential. The output O11 is coupled to the source terminals of the transistors 112A and 112B and is also coupled to an input of the current probe 110. The input of the current probe 110 and the output O11 are coupled to the reactive circuit 130. An output of the current probe 110 is coupled to an input of the signal generator 114.

The matchless plasma source 103 excludes an impedance match, such as an impedance matching network or an impedance matching circuit. Moreover, in some embodiments, there is no RF cable that couples the matchless plasma source 103 to the impedance matching circuit. For example, the impedance match is not coupled between the output O11 of the matchless plasma source 103 or of the half-bridge circuit 108 and the electrode 122 of the plasma load 116. The impedance match includes multiple circuit components, such as inductors and capacitors, to match an impedance of a load, such as a plasma chamber, that is coupled to the output of the impedance match with an impedance of a source, such as an RF generator and the RF cable, that is coupled to an input of the impedance match.

A majority of power that is generated by the matchless plasma source 103 is applied to the electrode 122. For example, because there is no impedance match and RF cable between the matchless plasma source 103 and the electrode 122, power is efficiently supplied from the matchless plasma source 103 to the electrode 122.

A substrate 128, such as a wafer, on which integrated circuits are fabricated, is placed within the plasma load 116 on a top surface of substrate support, such as a lower electrode or a wafer platen or a chuck, of the plasma load 116. The signal generator 114 operates at the operating frequency fRF to generate the pulsed signal 102 having the frequency fRF, which is a radio frequency. For example, the frequency fRF ranges from and including 50 kilohertz (kHz) to 100 megahertz (MHz). The pulsed signal 102 pulses between a low level, such as a logic level 0 or low power level, and a high level, such as a logic level 1 or a high power level, at a radio frequency. To illustrate, the pulsed signal 102 transitions at the radio frequency from the low level to the high level and transitions from the high level to the low level.

The pulsed signal 102 is supplied from the signal generator 114 to the gate drivers 118A and 118B. The gate driver 118A amplifies the pulsed signal 102 to generate a gate drive signal 106A. Also, the gate driver 118B amplifies and inverts the pulsed signal 102 to generate a gate drive signal 106B. Each gate drive signal 106A and 106B is a pulsed signal, such as a square wave signal or a clock signal or a digital waveform, having the frequency fRF.

The gate drive signal 106B is reversely pulsed compared to the gate drive signal 106A. For example, during a time or a time interval in which the gate drive signal 106A has a high level, such as a high power level, the gate drive signal 106B has a low level, such as low power level. Moreover, during a time or a time interval in which gate drive signal 106A has a low level, such as a low power level, the gate drive signal 106B has a high level, such as high power level. As another example, at a time or during a time interval in which the gate drive signal 106A transitions from the low level to the high level, the gate drive signal 106B transitions from the high level to the low level. Similarly, at a time or during a time interval in which the gate drive signal 106A transitions from the high level to the low level, the gate drive signal 106B transitions from the low level to the high level.

The reverse synchronization allows the transistors 112A and 112B to be consecutively operated in a successive manner, such as to be turned on consecutively and to be turned off consecutively. The transistors 112A and 112B are consecutively operated so that the transistors are not on at the same time or during the same time period. For example, when the transistor 112A is turned on, the transistor 112B is turned off and when the transistor 112B is turned on, the transistor 112A is turned off. To illustrate, during a time interval in which or a time at which the transistor 112A is turned on, the transistor 112B is turned off. Moreover, during a time interval in which or a time at which the transistor 112B is turned on, the transistor 112A is turned off.

When the transistor 112A is turned on and the transistor 112B is turned off, voltage across the transistor 112A increases and continues to go positive until the voltage is limited by the diode D1. Similarly, when the transistor 112A is turned off and the transistor 112B is turned on, voltage across the transistor 112B increases and continues to go negative until the voltage is limited by the diode D2. As such, the diode D1 reduces or prevents chances of a shoot through across the transistor 112A and the diode D2 reduces or prevents chances of a shoot through of voltage across the transistor 112B.

When the transistor 112A is on, a current flows from the voltage source Vdc via the transistor 112A to the output O11 to generate a voltage at the output O11 and the transistor 112B is off. When the transistor 112B is off, there is no current flowing from the output O11 to the ground potential that is coupled to the transistor 112B. The current flows from the output O11 to the reactive circuit 130. The current is pushed from the voltage source Vdc to the reactive circuit 130 when the transistor 112A is on. Moreover, when the transistor 112B is on, the transistor 112A is off and the voltage that is generated at the output O11 during the on state of the transistor 112A generates a current. The current that is generated flows from the output O11 to the ground potential coupled to the transistor 112B. The current is pulled from the output O11 to the ground potential when the transistor 112B is on. During a time interval in which or a time at which the transistor 112A is off, there is no current flowing from the voltage source Vdc to the output O11 via the transistor 112A.

The consecutive turning on and off of the transistors 112A and 112B is performed to generate a sinusoidal current waveform at the output O11. The sinusoidal current waveform has the radio frequency, such as the frequency fRF.

The current probe 110 measures a magnitude of the complex current of the sinusoidal current waveform generated at the output O11 to generate a feedback signal 124 and provides the feedback signal 124 to the signal generator 114. The feedback signal 124 includes a magnitude of the complex current of the sinusoidal current waveform generated at the output O11. The signal generator 114 determines whether a magnitude of the complex current measured at the output O11 is the approximate maximum. Upon determining that the magnitude of the complex current measured the output O11 is not the approximate maximum, the signal generator 114 changes a frequency of the pulsed signal 102. The pulsed signal 102 with the changed frequency is supplied to the gate drivers 118A and 118B. The gate drivers 118A and 118B modify the gate drive signals 106A and 106B according to the pulsed signal 102 having the changed frequency. For example, the radio frequency of the gate drive signals 106A and 106B is modified to match the changed frequency of the pulsed signal 102. The sinusoidal current waveform generated at the output O11 is modified based on the gate drive signals 106A and 106B that are modified. As an example, the radio frequency of the sinusoidal current waveform is modified to match the modified frequency of the gate drive signals 106A and 106B.

The current probe 110 measures a magnitude of the complex current of the sinusoidal current waveform whose radio frequency is modified and provides the magnitude to the signal generator 114. If the signal generator 114 determines that the magnitude of the complex current of the sinusoidal current waveform whose radio frequency is modified is the approximate maximum, then the signal generator 114 maintains the changed frequency of the pulsed signal 102. On the other hand, upon determining that the magnitude of the complex current of the sinusoidal current waveform whose radio frequency is modified is not the approximate maximum, the signal generator 114 changes the changed frequency of the pulsed signal 102. When the magnitude of the complex current of the sinusoidal current waveform at the output O11 is at the approximate maximum, a pre-determined amount of power is provided from the output O11 via the reactive circuit 130 to the electrode 122. For example, an approximate maximum amount of power is provided from the output O11 via the reactive circuit 130 to the electrode 122. The approximate maximum amount of power is greater than remaining amounts of power of the sinusoidal current waveform provided at the output O11 for which magnitudes of the complex current of the sinusoidal current waveform at the output O11 are not the approximate maximum.

The sinusoidal current waveform generated at the output O11 is supplied from the matchless plasma source 103 to the reactive circuit 130. The reactive circuit 130 removes, such as filters out, higher-order harmonics of the sinusoidal current waveform to generate a shaped sinusoidal waveform having a fundamental frequency. The shaped sinusoidal waveform has a shaped envelope, which is further described below.

The shaped sinusoidal waveform is sent from the reactive circuit 130 via the connection 126 to the electrode 122 for processing the substrate 128. For example, one or more process materials, such as fluorine containing gases, oxygen containing gases, nitrogen containing gases, liquids for deposition of metals and dielectrics, etc., are supplied to the plasma load 116. Upon receiving the shaped sinusoidal waveform and the process materials, plasma is lit within the plasma load 116 to process the substrate 128. Illustrations of processing the substrate 128 include depositing materials on the substrate 128, etching the substrate 128, cleaning the substrate 128, and sputtering the substrate 128.

Each transistor 112A and 112B is a field effect transistor (FET), such as a metal oxide semiconductor field effect transistor (MOSFET), and the FETs described herein are n-type. In some embodiments, instead of the n-type FETs, p-type FETs are used.

In various embodiments, instead of an FET, another type of transistor, such as an insulated-gate bipolar transistor (IGBT), or a metal semiconductor field effect transistor (MESFET), or a junction field effect transistor (JFET), may be used.

In various embodiments, instead of the TCP coil being used as the electrode 122, the chuck, or an upper capacitive electrode plate, or the substrate support, or an upper electrode of a showerhead is used.

Other examples of the plasma load 116 include a capacitively coupled plasma (CCP) chamber, a chemical vapor deposition (CVD) chamber, an atomic layer deposition (ALD) chamber, a plasma enhanced chemical vapor deposition (PECVD) chamber, a plasma etch chamber, a plasma deposition chamber, or a plasma enhanced atomic layer deposition (PEALD) chamber. The CCP chamber has the upper electrode and the lower electrode. The upper electrode is a capacitive plate that faces the lower electrode, which is also a capacitive plate. There is a gap between the upper and lower electrodes.

In some embodiments, in addition to the signal generator 114, a processor is used. The processor is coupled to the signal generator 114. The feedback signal 124 is provided to the processor and any determinations described herein as being made by the signal generator 114 are made by the processor of the signal generator 114. As used herein, a processor is sometimes referred to herein as a microprocessor, or a central processing unit (CPU), or an application-specific integrated circuit (ASIC), or programmable logic device (PLD).

In various embodiments, the current probe 110 is coupled at any point between the output O11 and the reactive circuit 130. For example, the current probe 110 is coupled to an input of the capacitor 120. The input of the capacitor 120 receives the sinusoidal current waveform from the output O11. As another example, the current probe 110 is coupled to a point on the connection 113.

Figure 2:
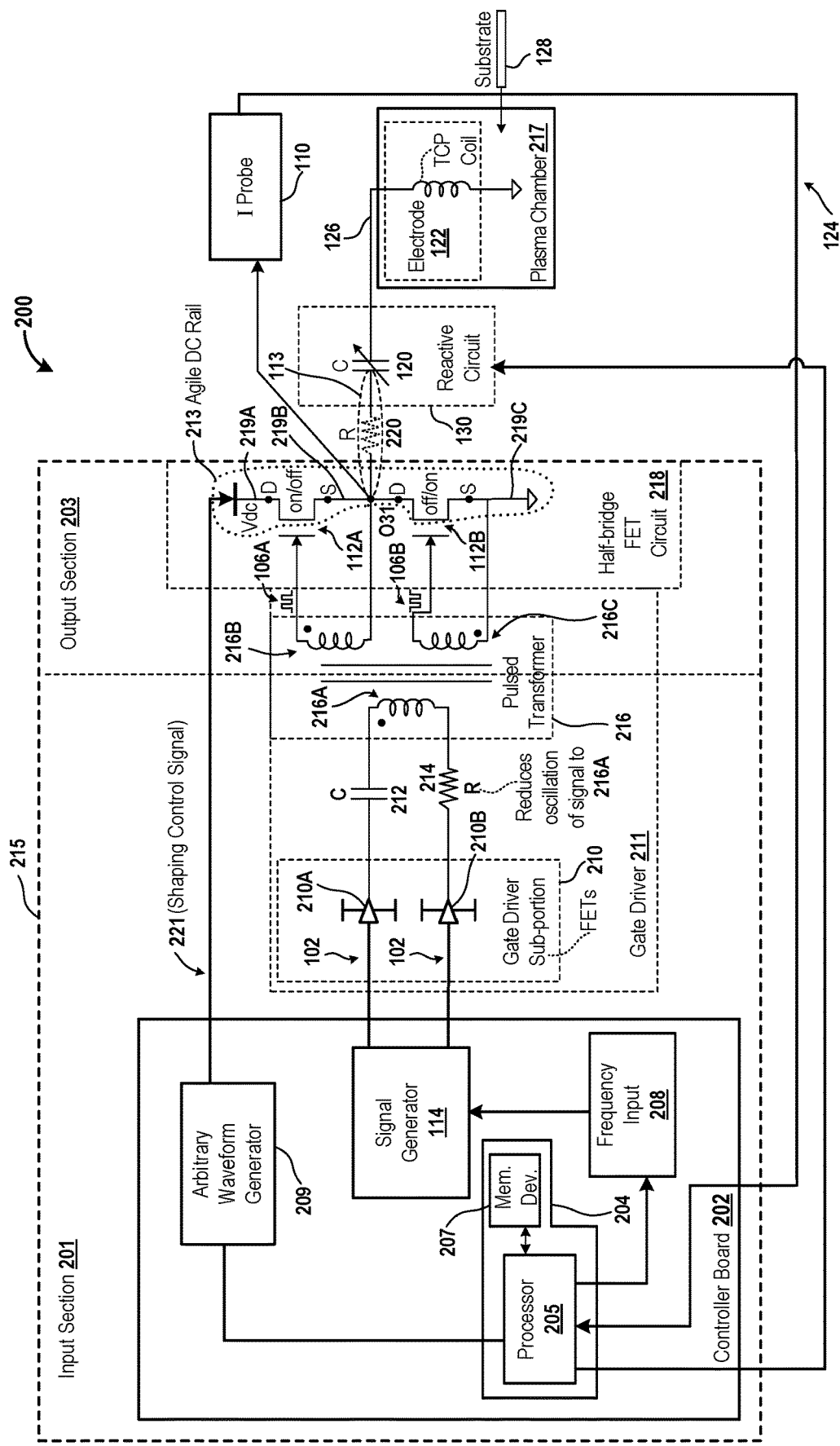
FIG. 2 is a diagram of an embodiment of a system to illustrate use of the current probe with a matchless plasma source.

FIG. 2 is a diagram of an embodiment of a system 200 to illustrate use of the current probe 110 with a matchless plasma source 215. The matchless plasma source 215 is an example of the matchless plasma source 103 of FIG. 1. The matchless plasma source 215 includes an input section 201 and an output section 203. The input section 201 includes a controller board 202 and a portion of a gate driver 211. The gate driver 211 is an example of the gate driver circuit 104 of FIG. 1. The gate driver 211 is coupled to the controller board 202. The output section 203 includes a remaining portion of the gate driver 211 and a half-bridge FET circuit 218. The half-bridge FET circuit 218 is an example of the half-bridge circuit 108 of FIG. 1. The half-bridge FET circuit 218 is coupled to the gate driver 211. A half-bridge FET circuit, as described herein, is sometimes referred to herein as an amplification circuit.

The controller board 202 includes a controller 204, the signal generator 114, and a frequency input 208. Examples of the frequency input 208 include a controller and a digital signal processor. For example, the frequency input 208 is another controller that is coupled to the controller 204. An example of any controller, such as the frequency input 208 or the controller 204, described herein, includes a processor and a memory device. Other examples of the controller, such as the frequency input 208 or the controller 204, described herein, include a microprocessor, a digital signal processor, an ASIC, a CPU, a processor, or a PLD, or a Field Programmable Gate Array (FPGA). Examples of a memory device include a read-only memory (ROM) and a random access memory (RAM). To illustrate, a memory device, as used herein, is a Flash memory or a hard disk or a dynamic RAM or a static RAM. The signal generator 114 generates the pulsed signal 102 at the frequency fRF, such as 400 kHz, or 2 MHz, or 13.56 MHz, or 27 MHz, or 60 MHz.

The gate driver 211 includes a gate driver sub-portion 210, a capacitor 212, a resistor 214, and a primary winding 216A of a transformer 216. The capacitor 212 has a capacitance that reduces, such as cancels or negates, an inductance of the primary winding 216A. The reduction of the inductance of the primary winding 216A facilitates generation of a square shape of the gate drive signals 106A and 106B. Moreover, the resistor 214 reduces an oscillation of the pulsed signal 102 that is generated by the signal generator 114. A resistance 220 is viewed by an output O31 of the half-bridge FET circuit 218. The output O31 is between the source terminal S of the transistor 112A and the drain terminal D of the transistor 112B. The output O31 is coupled to the reactive circuit 130 via the connection 113. The resistance 220 includes a stray resistance in the electrode 122. The resistance 220 also includes a stray resistance in plasma when lit within a plasma chamber 217, and further includes a stray resistance of the connection 126. The plasma chamber 217 is an example of the plasma load 116 of FIG. 1.

The gate driver 211 includes secondary windings 216B and 216C of the transformer 216. The gate driver sub-portion 210 includes multiple gate drivers 210A and 210B. Each of the gate drivers 210A and 210B are coupled to a positive voltage source at one end and to a negative voltage source at its opposite end.

The half-bridge FET circuit 218 includes the transistor 112A and the transistor 112B that are coupled to each other in a push-pull configuration. The half-bridge FET circuit 218 further includes a DC rail 213, which is illustrated within a dotted section. The DC rail 213 includes the voltage source Vdc, and a plurality of conductive elements 219A, 219B, and 219C, each of which is a conductor. The conductive element 219A is coupled to the drain terminal D of the transistor 112A and to the voltage source Vdc. Moreover, the conductive element 219B is coupled to the source terminal S of the transistor 112A and to the drain terminal D of the transistor 112B. Also, the conductive element 219C is coupled to the source terminal S of the transistor 112B and to the ground potential.

The system 200 further includes the current probe 110 that is coupled to the output O31 of the half-bridge FET circuit 218. The output O31 is an example of the output O11 of FIG. 1. The output O31 is coupled to the voltage source Vdc via the transistor 112A. For example, the output O31 is coupled to the source terminal S of the transistor 112A and the drain terminal D of the transistor 112A is coupled to the voltage source Vdc.

It should be noted that a voltage and current (VI) probe is not coupled to the output O31 or at any point on the connection 113 between the output O31 and the reactive circuit 130. The VI probe is a sensor that measures a complex current at the output O31, a complex voltage at the output O31, and a phase difference between the complex voltage and the complex current. A complex voltage, as described herein, has a magnitude and a phase. Similarly, a complex current, as described herein, has a magnitude and a phase. Moreover, it should be noted that a voltage probe is not coupled to the output O31 or at any point on the connection 113 between the output O31 and the reactive circuit 130. The voltage probe is a sensor that measures the complex voltage at the output O31. The voltage probe does not measure the complex current at the output O31. The current probe 110 is coupled to the processor 205 of the controller 204 to provide the feedback signal 124.

The processor 205 of the controller 204 is coupled to the signal generator 114 via the frequency input 208. The frequency input 208 has a memory device that stores values of the operating frequency fRF. The processor 205 of the controller 204 is further coupled via a conductor to the voltage source Vdc of the DC rail 213. Moreover, outputs of the signal generator 114 are coupled to the gate drivers 210A and 210B. The gate driver 210A is coupled to the capacitor 212 and the gate driver 210B is coupled to the resistor 214. The capacitor 212 and the resistor 214 are coupled to the primary winding 216A of the transformer 216.

Moreover, the secondary winding 216B of the transformer 216 is coupled to the input gate terminal of the transistor 112A and the secondary winding 216C of the transformer 216 is coupled to the input gate terminal of the transistor 112B. The output O31 of the half-bridge FET circuit 218 is coupled to the capacitor 120 and the capacitor 120 is coupled via the connection 126 to the TCP coil of the electrode 122.

The processor 205 generates a control signal and sends the control signal to the frequency input 208. Upon receiving the control signal, a processor of the frequency input 208 obtains a value of the operating frequency fRF from the memory device of the frequency input 208 and provides the value to the signal generator 114. The frequency input 208 stores values, such as 2 MHz or 13.56 MHz, of the operating frequency fRF. The signal generator 114 generates the pulsed signal 102 having the operating frequency fRF upon receiving the value of the operating frequency fRF from the frequency input 208. The gate drivers 210A and 210B amplify the pulsed signal 102 to generate amplified RF power and provide the amplified RF power to the primary winding 216A of the transformer 216.

Based on a directionality of flow of current of the amplified RF power, either the secondary winding 216B or the secondary winding 216C generates a gate drive signal having a threshold voltage. For example, when a current of the amplified RF power flows from a positively charged terminal, indicated by a dot, of the primary winding 216A to a negatively charged terminal, lacking a dot, of the primary winding 216A, the secondary winding 216B generates the gate drive signal 106A having the threshold voltage to turn on the transistor 112A and the secondary winding 216C does not generate the threshold voltage and the transistor 112B is off. On the other hand, when the current of the amplified RF power flows from the negatively charged terminal of the primary winding 216A to the positively charged terminal of the primary winding 216A, the secondary winding 216C generates the gate drive signal 106B having the threshold voltage to turn on the transistor 112B and the secondary winding 216B does not generate the threshold voltage and the transistor 112A is off.

When the transistor 112A is on, a current flows from the voltage source Vdc to the output O31 via the transistor 112A to generate a voltage at the output O31 and the transistor 112B is off. When the transistor 112A is on and the transistor 112B is off, the voltage at the output O31 generates the complex current of the sinusoidal current waveform and the current flows to the reactive circuit 130. The voltage at the output O31 is generated according to voltage values received from an arbitrary waveform generator 209, which is further described below. For example, the voltage values of the voltage source Vdc are supplied from the arbitrary waveform generator 209 to the voltage source Vdc. An example of the arbitrary waveform generator 209 is a controller. Another example of the arbitrary waveform generator 209 is a digital signal processor. The arbitrary waveform generator 209 supplies the voltage values to the voltage source Vdc under control of the processor 205 and is coupled to the processor 205. When the transistor 112B is off, there is no current flowing from the output O31 to the ground potential that is coupled to the transistor 112B. When the transistor 112B is on, the transistor 112A is off and the voltage that is generated at the output O31 generates a current that flows from the output O31 via the transistor 112B to the ground potential coupled to the transistor 112B. When the transistor 112A is off and the transistor 112B is on, the voltage at the output O31 generates the complex current of the sinusoidal current waveform and the current flows to the reactive circuit 130. When the transistor 112A is off, there is no current flowing from the voltage source Vdc to the output O31.

Furthermore, the arbitrary waveform generator 209 generates a shaping control signal 211 having the voltage values and provides the shaping control signal 221 to the voltage source Vdc via a conductor that couples the voltage source Vdc to the arbitrary waveform generator 209. The voltage values range, for example, from zero to eighty volts so that the agile DC rail 213 operates in the range. The voltage values are magnitudes of a voltage signal generated by the voltage source Vdc to define the shaped envelope of the voltage signal to further define the shaped envelope of the sinusoidal current waveform at the output O31. For example, to generate a continuous waveform at the output O31, the voltage values provide a peak-to-peak magnitude of the continuous waveform. The peak-to-peak magnitude defines the shaped envelope of the continuous waveform. As another example, to generate the sinusoidal current waveform that has the shaped envelope of a pulsed shape at the output O31, the voltage values are changed substantially instantaneously, such as at a time or during a pre-set time period, so that a peak-to-peak magnitude of the sinusoidal current waveform changes from a first parameter level, such as a high level, to a second parameter level, such as a low level, or changes from the second parameter level to the first parameter level. The voltage values are changed periodically to achieve the shaped envelope of the pulsed shape. As yet another example, to generate the sinusoidal current waveform that has the shaped envelope of an arbitrary shape at the output O31, the voltage values are changed in an arbitrary manner by the arbitrary waveform generator 209 so that a peak-to-peak magnitude of the sinusoidal current waveform changes in a pre-set manner. As yet another example, to generate the sinusoidal current waveform that has the shaped envelope of a multi-state pulsed shape at the output O31, the voltage values are changed substantially instantaneously, such as at a time, so that a peak-to-peak magnitude of the sinusoidal current waveform changes from a high parameter level to one or more middle levels, and then changes from the one or more middle levels to another level, such as a low parameter level or the high parameter level. It should be noted that the sinusoidal current waveform that has the shaped envelope of the multi-state pulsed shape has any number of states, such as ranging from two to a thousand.

A parameter level as used herein includes one or more parameter values which are exclusive of one or more parameter values of another parameter level. For example, a power amount at a parameter level is greater than or less than a power amount at a different parameter level. Examples of the parameter include current, voltage, and power.

By consecutively operating the transistors 112A and 112B based on the gate drive signals 106A and 106B and controlling the voltage source Vdc to change the voltage values, the sinusoidal current waveform is generated at the output O31. The sinusoidal current waveform has the shaped envelope. The capacitor 120 in combination with the inductance of the TCP coil, receives the sinusoidal current waveform and reduces, such as removes or filters, the higher-order harmonics of the sinusoidal current waveform to generate the shaped sinusoidal waveform having the fundamental frequency. The shaped sinusoidal waveform also has the shaped envelope. The shaped sinusoidal waveform is supplied from an output of the capacitor 120 via the connection 126 to the TCP coil of the electrode 122 to ignite or maintain plasma within the plasma chamber 217. The plasma is used to process the substrate 128.

The current probe 110 measures the complex current of the sinusoidal current waveform at the output O31 and provides the feedback signal 124, which includes a magnitude of the complex current, to the processor 205. The processor 205 determines whether the magnitude of the complex current measured at the output O31 is the approximate maximum. Upon determining that the magnitude of complex current measured at the output O31 is not the approximate maximum, the processor 205 sends a control signal to the frequency input 208 to modify a value of the operating frequency fRF of the signal generator 114. Upon receiving the control signal, the frequency input 208 generates and sends a signal having the modified value of the operating frequency fRF to the signal generator 114. Upon receiving the signal from the frequency input 208, the signal generator generates the pulsed signal 102 having the modified value of the operating frequency fRF. As such, until the magnitude of the complex current measured the output O31 is the approximate maximum, the processor 205 continues to send a control signal to the frequency input 208 to modify the operating frequency fRF of the signal generator 114. When the magnitude of the complex current at the output O31 is the approximate maximum, an approximate maximum amount of power is being supplied to the electrode 122 to improve efficiency of processing the substrate 128.

Components, such as transistors, of the matchless plasma source 103 are electronic. Moreover, there is no RF match and RF cable between the matchless plasma source 103 and the electrode 122. The electronic components and the lack of the RF match and the RF cable facilitates repeatability and consistency to facilitate fast plasma ignition and plasma sustainability.

In various embodiments, the current probe 110 is coupled at any point between the output O31 and the reactive circuit 130. For example, the current probe 110 is coupled to the input of the capacitor 120. The input of the capacitor 120 receives the sinusoidal current waveform from the output O31. As another example, the current probe 110 is coupled to a point on the connection 113 coupling the output O31 to the reactive circuit 130.

In some embodiments, functions described herein as performed by the processor 205, the arbitrary waveform generator 209, and the frequency input 208 are performed by one or more controllers or by one or more processors.

In various embodiments, functions described herein as performed by the processor 205 and the arbitrary waveform generator 209 are performed by one or more controllers or by one or more processors. For example, the arbitrary waveform generator 209 is a part of the processor 205. To illustrate, functions described herein as being performed by the arbitrary waveform generator 209 are performed by the processor 205.

In several embodiments, functions described herein as performed by the processor 205 and the frequency input 208 are performed by one or more controllers or by one or more processors. For example, the frequency input 208 is a part of the processor 205. To illustrate, functions described herein has been performed by the frequency input 208 are performed by the processor 205.

In some embodiments, functions described herein as performed by the arbitrary waveform generator 209 and the frequency input 208 are performed by one or more controllers or by one or more processors.

In several embodiments, instead of the transformer 216 being used as a portion of the gate driver 211, transistors, such as FETs or IGBTs or MESFETs or JFETs, are coupled with each other to produce the portion of the gate driver 211.

In various embodiments, the matchless plasma source 215 excludes the resistor 214, or the capacitor 212, or both the capacitor 212 and the resistor 214.

In some embodiments, the matchless plasma source 215 includes the diodes D1 and D2 of FIG. 1.

Figure 3:
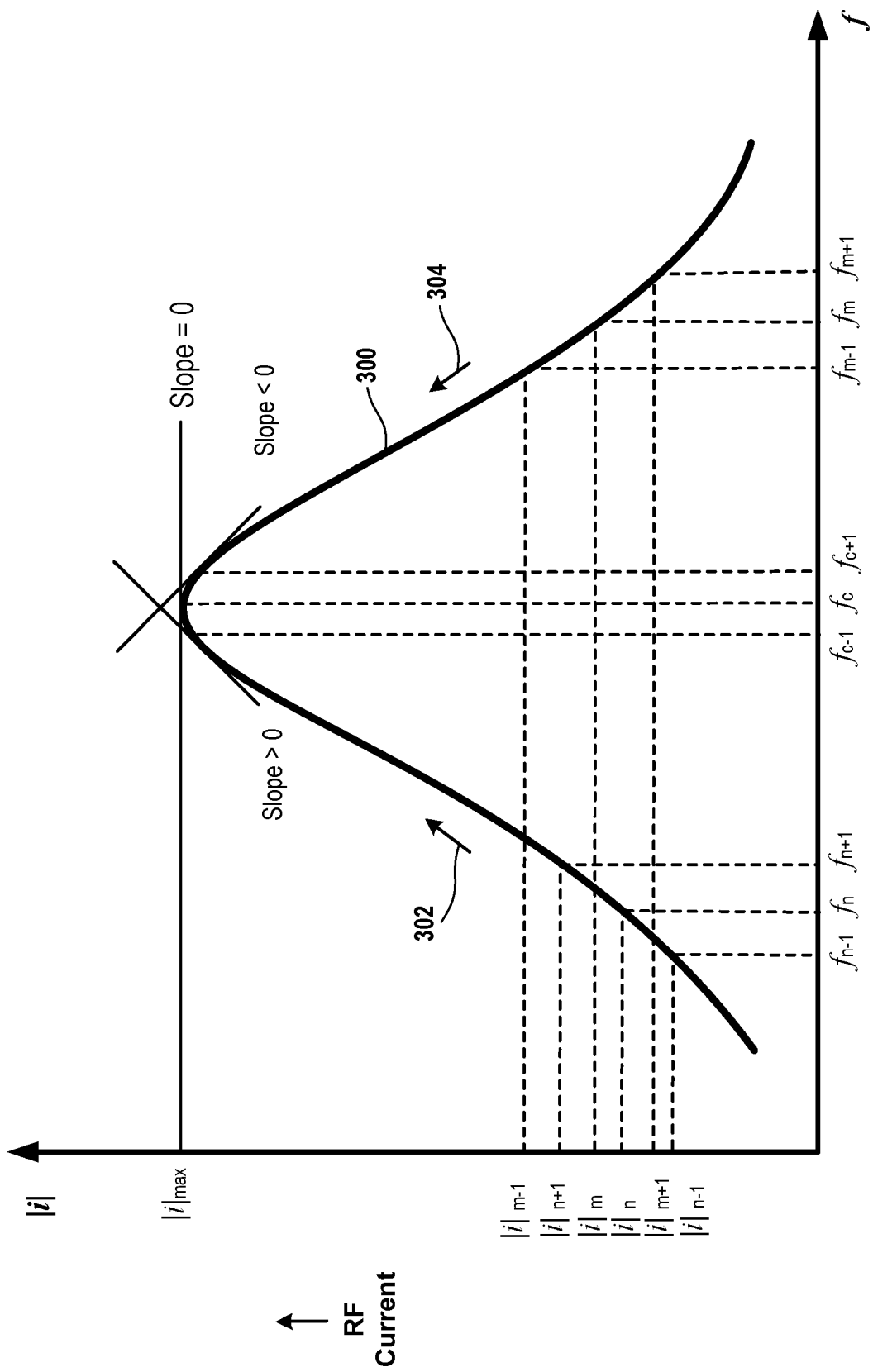
FIG. 3 is an embodiment of a graph to illustrate a method for determining an approximate maximum magnitude of a complex current of a sinusoidal current waveform at an output of the matchless plasma source of FIG. 1 or the matchless plasma source of FIG. 2.

FIG. 3 is an embodiment of a graph 300 to illustrate a method for determining the approximate maximum magnitude of the complex current of the sinusoidal current waveform at an output, such as the output O11 (FIG. 1) or the output O31 (FIG. 2), of a half-bridge circuit, described herein. The graph 300 plots a magnitude of the complex current at the output of the half-bridge circuit versus the frequency fRF. The processor 205 (FIG. 2) stores within the memory device 207 (FIG. 2) a frequency resolution $\Delta f$, and a pre-determined range of the operating frequency fRF. An example of the pre-determined range is a range between 50 kHz to 100 MHz. Another example of the pre-determined range is a range between 100 kHz and 50 MHz. The pre-determined range is stored in the memory device 207. At a time or during a pre-determined time period in which the operating frequency fRF has a starting value of $f_n$ with a current magnitude of at the output of the half-bridge circuit, the processor 205 increments the operating frequency fRF from $f_n$ to $f_{n+1}$ towards a increasing frequency direction 302 to find a corresponding current magnitude $|i|_{n+1}$ of the complex current of the sinusoidal current waveform at the output of the half-bridge circuit, where $f_{n+1}=f_n+\Delta f$. Similarly, at a time or during the pre-determined time period in which the operating frequency fRF has a starting value of $f_m$ with a current magnitude of $|i|_m$ at the output of the half-bridge circuit, the processor 205 increments the operating frequency fRF from $f_m$ to $f_{m+1}$ towards the increasing frequency direction 302 to find a corresponding current magnitude $|i|_{m+1}$ of the complex current of the sinusoidal current waveform at the output of the half-bridge circuit, where $f_{m+1}=f_m+\Delta f$.

The processor 205 compares the magnitude $|i|_{n+1}$ with $|i|_n$ or the magnitude $|i|_{m+1}$ with $|i|_m$. If a magnitude of the complex current of the sinusoidal current waveform at the output of the half-bridge circuit is increasing in a frequency searching direction, for example, in a case of $|i|_n$ compared to $|i|_{n+1}$, the processor 205 continues to progress in the increasing frequency direction 302 to the next value $f_{n+1}$ of the operating frequency fRF of the signal generator 114. If a magnitude of the complex current of the sinusoidal current waveform at the output of the half-bridge circuit is decreasing in the frequency searching direction, for example, in a case of $|i|_m$ compared to the processor 205 reverses the frequency searching direction and decreases the value $f_m$ to $f_{m-1}$ to search in a decreasing frequency direction 304, which is opposite to the increasing frequency direction 302. That is, if an $|i|$-f curve represented by the graph 300 has a positive slope at a value of the operating frequency fRF, the processor 205 increases the value. On the other hand, if the $|i|$-f curve represented by the graph 300 has a negative slope at a value of the operating frequency fRF, the processor 205 decreases the value.

When the operating frequency fRF reaches a value $f_c$ of the operating frequency fRF from the increasing frequency direction 302 or from the decreasing frequency direction 304, where a slope of the $|i|$-f curve at a value $f_{c+1}$ of the operating frequency fRF is negative and a slope of the $|i|$-f curve at a value $f_{c-1}$ is positive, the processor 205 completes a searching process and the frequency fRF is tuned by the processor 205 to a value that achieves the approximate maximum magnitude, such as a maximum current magnitude $|i|_{max}$.

In some embodiments, to increase an accuracy of the value $f_c$ and tuning speed, the frequency resolution $\Delta f$ is adjustable by the processor 205. The frequency resolution $\Delta f$ is smaller when the frequency searching direction approaches the value $f_c$, such as, is within a pre-set limit from the value $f_c$. The frequency resolution $\Delta f$ is larger when the frequency searching direction is far from the value $f_c$.

It should be noted that the frequency searching direction is either the increasing frequency direction 302 or the decreasing frequency direction 304.

Figure 4:
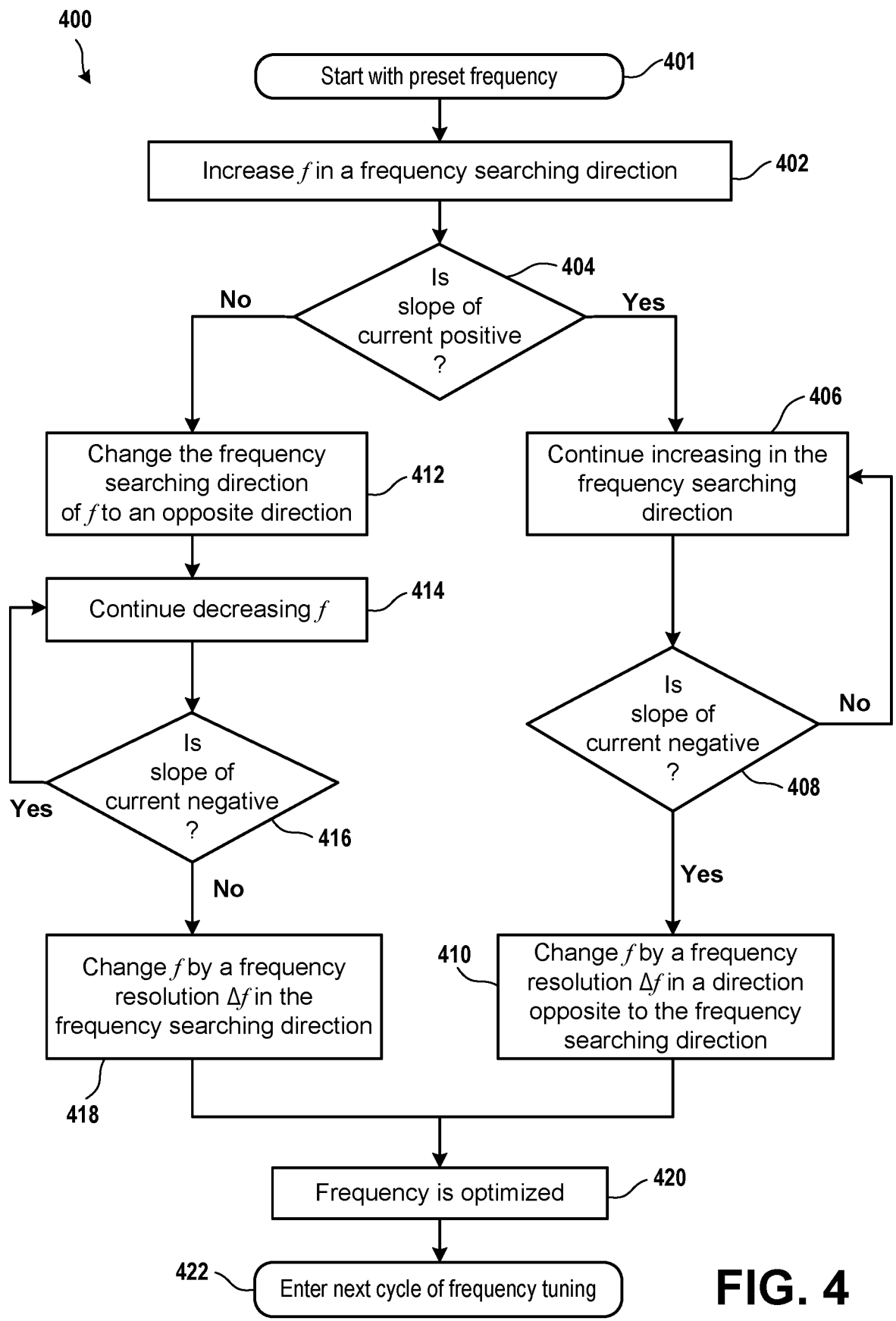
FIG. 4 is an embodiment to a flowchart of a method to explain in detail the method illustrated with reference to FIG. 3.

FIG. 4 is an embodiment to a flowchart of a method 400 to explain in detail the method illustrated with reference to FIG. 3. The flowchart is explained, in general, as follows. Let's assume the frequency resolution to be $\Delta f$.

In an operation 401, the starting frequency with the corresponding current magnitude of $|i|_n$ or $|i|_m$ is $f_n$ or $f_m$. In an operation 402, the operating frequency of the signal generator 114 is incremented to $f_{n+1}$ or $f_{m+1}$ towards the increasing frequency direction to find the corresponding current magnitude $|i|_{n+1}$ or $|i|_{n+1}$ where $f_{n+1}=+\Delta f$ or $f_{m+1}=f_m+\Delta f$.

In an operation 404, the magnitude is compared with or the magnitude $|i|_m$ is compared to $|i|_{m+1}$. If the current magnitude is increasing in the frequency searching direction, for example, in a case of versus the operating frequency is increased in the frequency searching direction to $f_{n+1}$ in an operation 406. However, if the current magnitude is decreasing in the frequency searching direction, for example, in the case of $|i|_m$ and the frequency searching direction is reversed in an operation 412 and the frequency $f_m$ is decreased, in an operation 414, to $f_{m-1}$. That is, if the $|i|$-f curve represented by the graph 300 of FIG. 3 has a positive slope at the present operating frequency of the signal generator 114, the operating frequency is increased. If the $|i|$-f curve has a negative slope at the present operating frequency of the signal generator 114, the operating frequency is decreased.

Then operations 408, 416, 410, and 418 are performed. When the operating frequency of the signal generator 114 reaches $f_c$, where the slope of the graph 300 at $f_{c+1}$ is negative and the slope of the graph 300 at $f_{c-1}$ is positive, searching process for the operating frequency of the signal generator 114 is completed and the operating frequency is tuned to a value that achieves the approximate maximum of the complex current at the output of the half-bridge circuit. When the operating frequency is tuned to the value that achieves the approximate maximum of the complex current at the output of the half-bridge circuit, the operating frequency is optimized in an operation 420. In an operation 422, another cycle of tuning of the operating frequency of the signal generator 114 follows next. For example, the method 400 repeats.

In some embodiments, to increase an accuracy of $f_c$ and tuning speed, the frequency resolution $\Delta f$ is adjustable. The frequency resolution $\Delta f$ is smaller when the operating frequency of the signal generator 114 approaches $f_c$ or in a small neighborhood of $f_c$ and the frequency resolution $\Delta f$ is larger when the operating frequency of the signal generator 114 is far from $f_c$.

The flowchart of the method 400 is now explained in detail. In the operation 401, the processor 205 operates the signal generator 114 at the operating frequency of $f_n$ or $f_m$. For example, the processor 205 sends a control signal to the frequency input 208 (FIG. 2) to operate the signal generator 114 at the value $f_n$ or $f_m$. Upon receiving the control signal, the frequency input 208 provides the value $f_n$ or $f_m$ to the signal generator 114. The signal generator 114, upon receiving the value $f_n$ or $f_m$, generates the pulsed signal 102 having the frequency $f_n$ or $f_m$.

In the operation 402, the processor 205 increases the operating frequency of the signal generator 114 in the frequency searching direction. For example, the processor 205 sends a control signal to the frequency input 208 (FIG. 2) to change the value $f_n$ to another value $f_{n+1}$, which is equal to $f_n+\Delta f$. It should be noted that in this example, the frequency resolution $\Delta f$ is an increment. Upon receiving the control signal, the frequency input 208 changes a value of the operating frequency fRF from $f_n$ to $f_{n+1}$, and provides the value $f_{n+1}$ to the signal generator 114. The signal generator 114, upon receiving the value $f_{n+1}$, generates the pulsed signal 102 having the frequency $f_{n+1}$. As another example, the processor 205 sends a control signal to the frequency input 208 (FIG. 2) to change the value $f_m$ to another value $f_{m+1}$, which is equal to $f_m+\Delta f$. In this example, the resolution $\Delta f$ is an increment. Upon receiving the control signal, the frequency input 208 changes a value of the operating frequency of the signal generator 114 from $f_m$ to $f_{m+1}$, and provides the value $f_{m+1}$ to the signal generator 114. The signal generator 114, upon receiving the value $f_{m+1}$, generates the pulsed signal 102 having the frequency $f_{m+1}$.

The processor 205 determines, in the operation 404, whether a current magnitude of the complex current of the sinusoidal current waveform at the output of the half-bridge circuit is increasing or decreasing in the frequency searching direction. That is, the processor 205 determines, in the operation 404, whether a slope between magnitudes of the complex current of the sinusoidal current waveform at the output of the half-bridge circuit is positive or negative. For example, the processor 205 determines whether a slope between the magnitudes $|i|_{n+1}$ and $|i|_n$ of the graph 300 is positive. The slope is calculated by the processor 205 to be a ratio of a difference between the magnitudes $|i|_{n+1}$ and $|i|_n$ and a difference between the values $f_{n+1}$ and $f_n$. When the operating frequency of the signal generator 114 is $f_n$, the current probe 110 measures the magnitude $|i|_n$ of the complex current of the sinusoidal current waveform at the output of the half-bridge circuit and sends the magnitude $|i|_n$ to the processor 205. The current probe 110 measures the magnitude of the complex current of the sinusoidal current waveform at the output of the half-bridge circuit for which the operating frequency fRF has the value $f_{n+1}$, and sends the magnitude $|i|_{n+1}$ to the processor 205. As another example, the processor 205 determines whether a slope of the graph 300 between the magnitudes $|i|_{m+1}$ and $|i|_m$ is positive. The slope is calculated by the processor 205 to be a ratio of a difference between the magnitudes $|i|_{m+1}$ and $|i|_m$ and a difference between the values $f_{m+1}$ and $f_m$. When the frequency fRF is $f_m$, the current probe 110 measures the magnitude $|i|_m$ of the complex current of the sinusoidal current waveform at the output of the half-bridge circuit and sends the magnitude $|i|_m$ to the processor 205. The current probe 110 measures the magnitude $|i|_{m+1}$ of the complex current of the sinusoidal current waveform at the output of the half-bridge circuit for which the operating frequency fRF has the value $f_{m+1}$, and sends the magnitude $|i|_{m+1}$ to the processor 205. As yet another example, the processor 205 determines whether the magnitude $|i|_{n+1}$ is greater than the magnitude $|i|_n$ or determines whether the magnitude $|i|_{m+1}$ is greater than the magnitude $|i|_m$. Upon determining that the magnitude is greater than the magnitude $|i|_{n+1}$ or the magnitude $|i|_{m+1}$ is greater than the magnitude $|i|_m$, the processor 205 determines that the current magnitude of the complex current of the sinusoidal current waveform at the output of the half-bridge circuit is increasing in the frequency searching direction.

In the operation 406, upon determining that the current magnitude of the complex current of the sinusoidal current waveform at the output of the half-bridge circuit is increasing in the frequency searching direction, the processor 205 continues increasing the operating frequency of the signal generator 114 in the frequency searching direction. That is, in the operation 406, upon determining that the slope of magnitudes of the complex current of the sinusoidal current waveform at the output of the half-bridge circuit is positive, the processor 205 continues increasing the operating frequency of the signal generator 114 in the frequency searching direction for which the slope is positive.

In this manner, the processor 205 continues, in the operation 406, to increment the operating frequency of the signal generator 114 until, in the operation 408, the current magnitude of the complex current of the sinusoidal current waveform at the output of the half-bridge circuit starts decreasing in the frequency searching direction. That is, the processor 205 continues, in the operation 406, to increment the operating frequency of the signal generator 114 until, in the operation 408, the slope of magnitudes of the complex current of the sinusoidal current waveform at the output of the half-bridge circuit becomes negative. For example, the processor 205 continues to increase the frequency from $f_{n+1}$ to $f_{c-1}$, further increments the operating frequency fRF from $f_{c-1}$ to $f_c$, and yet further increments the operating frequency fRF from $f_c$ to $f_{c+1}$. It should be noted that a difference between the values $f_{c-1}$ and $f_c$ is equal to $\Delta f$ and a difference between the values $f_{c+1}$ and $f_c$ is equal to $\Delta f$. The processor 205, in the example, determines that a magnitude $|i|_c$ is greater than a magnitude $|i|_{c-1}$ and that a magnitude $|i|_{c+1}$ is less than the magnitude $|i|_c$ to determine that the magnitude of the complex current at the output of the half-bridge circuit does not increase with an increase in the operating frequency fRF. Continuing with the example, the value $f_{c-1}$ is one for which the magnitude of the complex current at the output of the half-bridge circuit is measured by the current probe 110 and the value $f_c$ is one for which the magnitude $|i|_c$ of the complex current at the output of the half-bridge circuit is measured by the current probe 110. Also, continuing with the example, the value $f_{c+1}$ of the operating frequency fRF is one for which the magnitude $|i|_{c+1}$ of the complex current at the output of the half-bridge circuit is measured by the current probe 110.

As another example, the processor 205 continues to increment the operating frequency fRF from $f_{n+1}$ to $f_{n-1}$, from $f_{c-1}$ to $f_c$, and from $f_c$ to $f_{c+1}$ until a slope of the graph 300 at the output of the half-bridge circuit becomes negative. In the example, the processor 205 determines whether a slope of the graph 300 for the magnitudes $|i|_c$ and $|i|_{c-1}$ is positive and a slope of the graph 300 for the magnitudes $|i|_{c+1}$ and $|i|_c$ is negative. The slope for the magnitudes $|i|_c$ and $|i|_{c-1}$ is calculated by the processor 205 to be a ratio of a difference between the magnitudes $|i|_{c+1}$ and $|i|_c$ and a difference between the values $f_c$ and $f_{c-1}$. The slope for the magnitudes $|i|_{c+1}$ and $|i|_c$ is calculated by the processor 205 to be a ratio of a difference between the magnitudes $|i|_{c+1}$ and $|i|_c$ and a difference between the values $f_{c+1}$ and $f_c$. The processor 205 determines that the slope of the graph 300 for the magnitudes $|i|_c$ and is positive with an increment in the operating frequency fRF from $f_{c-1}$ to $f_n$ and the slope of the graph 300 for the magnitudes $|i|_{c+1}$ and $|i|_c$ is negative with an increment in the operating frequency fRF from $f_c$ to $f_{c+1}$ to determine that the magnitude of the complex current at the output of the half-bridge circuit decreases with an increase in the operating frequency of the signal generator 114.

Upon determining, in the operation 408, that a magnitude of the complex current at the output of the half bridge circuit starts to decrease with an increase in the operating frequency of the signal generator 114, the processor 205, in the operation 410, sends a control signal to the frequency input 208 to decrement the frequency value $f_{c+1}$ to $f_c$ to operate the signal generator 114 at the value $f_c$ for which the complex current at the output of the half-bridge circuit is the approximate maximum. That is upon determining, in the operation 408, that the slope of the complex current at the output of the half bridge circuit becomes negative with an increase in the operating frequency of the signal generator 114, the processor 205, in the operation 410, sends a control signal to the frequency input 208 to decrement the frequency value $f_{c+1}$ to $f_c$ to operate the signal generator 114 at the value $f_c$ for which the complex current at the output of the half-bridge circuit is the approximate maximum. Upon receiving the control signal from the processor 205, the frequency input 208 provides the value $f_c$ to the signal generator 114. The signal generator 114 upon receiving the value $f_c$ from the frequency input 208 generates the pulsed signal 102 having the value $f_c$.

On the other hand, upon determining in the operation 404 that the current magnitude of the complex current of the sinusoidal current waveform at the output of the half-bridge circuit is decreasing in the frequency searching direction, the processor 205, in the operation 412, changes the frequency searching direction to a direction opposite to the frequency searching direction. That is, in the operation 412, upon determining that the slope of magnitudes of the complex current of the sinusoidal current waveform at the output of the half-bridge circuit is negative, the processor 205 changes the frequency searching direction to the opposite direction to decrease the operating frequency of the signal generator 114. For example, the processor 205, in the operation 412, sends a control signal to the frequency input 208 (FIG. 2) to change the value $f_m$ to another value $f_{m-1}$, which is equal to $f_m - \Delta f$. In this example, the resolution $\Delta f$ is a decrement. Upon receiving the control signal, the frequency input 208 changes a value of the operating frequency of the signal generator 114 from $f_m$ to $f_{m-1}$, and provides the value $f_{m-1}$ to the signal generator 114. The signal generator 114, upon receiving the value $f_{m-1}$, generates the pulsed signal 102 having the frequency $f_{m-1}$.

The processor 205, in the operation 414, continues to decrease the operating frequency of the signal generator 114 until it is determined in another operation 416 that a magnitude of the complex current at the output of the half-bridge circuit decreases with a decrease in the operating frequency. That is, the processor 205, in the operation 414, continues to decrease the operating frequency until it is determined in the operation 416 that the slope of magnitudes of the complex current of the sinusoidal current waveform at the output of the half-bridge circuit becomes positive. For example, the processor 205 continues to decrement the operating frequency of the signal generator 114 from $f_{m-1}$ to $f_{c+1}$, further decrements the operating frequency fRF from $f_{c+1}$ to $f_c$, and yet further decrements the operating frequency fRF from $f_c$ to $f_{c-1}$. In the example, the processor 205 determines that the magnitude $|i|_c$ is greater than the magnitude $|i|_{c+1}$ and that the magnitude is less than the magnitude $|i|_c$ to determine that the magnitude of the complex current at the output of the half-bridge circuit decreases with a decrease in the operating frequency of the signal generator 114. As another example, the processor 205 continues to decrease the operating frequency fRF from $f_{m-1}$ to $f_{c+1}$, further decrements the operating frequency fRF from $f_{c+1}$ to $f_c$, and yet further decrements the operating frequency fRF from $f_c$ to $f_{c-1}$ until a slope of the graph 300 at the output of the half-bridge circuit becomes positive. In the example, the processor 205 determines that a slope of the graph 300 for the magnitudes $|i|_{c+1}$ and $|i|_c$ is negative and a slope of the graph 300 for the magnitudes $|i|_c$ and $|i|_{c-1}$ is positive.

Upon determining that the magnitude of the complex current at the output of the half-bridge circuit decreases with a decrease in the operating frequency of the signal generator 114, the processor 205, in the operation 418, sends a control signal to the frequency input 208 to increment the frequency value $f_{c-1}$ to $f_c$ to operate the signal generator 114 at the value $f_c$ for which the complex current at the output of the half-bridge circuit is the approximate maximum. That is, upon determining that the slope of magnitudes of the complex current of the sinusoidal current waveform at the output of the half-bridge circuit becomes positive, the processor 205, in the operation 418, sends a control signal to the frequency input 208 to increment the frequency value $f_{c-1}$ to $f_c$ to operate the signal generator 114 at the value $f_c$ for which the complex current at the output of the half-bridge circuit is the approximate maximum. As represented by the operation 420, when the operating frequency has the value $f_c$, the operating frequency is optimized.

In some embodiments, the output of the half-bridge circuit, as used herein, is the output O11 (FIG. 1) or any point between the output O11 and the reactive circuit 130. To illustrate, the output of the half-bridge circuit is a point on the connection 113 that couples the output O11 to the input of the reactive circuit 130.

In various embodiments, the output of the half-bridge circuit, as used herein, is the output O31 (FIG. 2) or any point between the output O31 and the reactive circuit 130. To illustrate, the output of the half-bridge circuit is a point on the connection 113 that couples the output O31 to the input of the reactive circuit 130.

In some embodiments, the processor increases the frequency resolution $\Delta f$ as the frequency searching direction approaches the value $f_c$, such as is within the pre-set limit from the value $f_c$. For example, the processor 205 decreases a difference between the values $f_c$ and $f_{c-1}$ compared to a difference between the values $f_n$ and $f_{n-1}$ or a difference between the values $f_{n+1}$ and $f_n$. As another example, the processor 205 decreases a difference between the values $f_{c+1}$ and $f_c$ compared to a difference between the values $f_n$ and $f_{n-1}$ or a difference between the values $f_{n+1}$ and $f_n$. As another example, the processor 205 decreases a difference between the values $f_c$ and $f_{c-1}$ compared to a difference between the values $f_{m-1}$ and $f_m$ or a difference between the values $f_{m+1}$ and $f_m$. As another example, the processor 205 decreases a difference between the values $f_{c+1}$ and $f_c$ compared to a difference between the values $f_{m-1}$ and $f_m$ or a difference between the values $f_{m+1}$ and $f_m$.

In these embodiments, to determine that the frequency searching direction is approaching the value $f_c$, the processor 205 determines that whether a slope of the graph 300 is within a pre-defined range from zero. For example, when the operating frequency fRF is at a value $f_{c-1}$, the processor 205 determines that the slope for the magnitudes $|i|_c$ and $|i|_{c-1}$ is within the pre-defined range from zero. Upon determining that the slope for the magnitudes $|i|_c$ and $|i|_{c-1}$ is within the pre-defined range from zero, the processor 205 reduces the difference $\Delta f$ between the values $f_c$ and $f_{c-1}$ compared to the difference M between the values $f_{n+1}$ and $f_n$ or the values $f_{m-1}$ and $f_m$. As another example, when the operating frequency fRF is at a value $f_{c+1}$, the processor 205 computes that the slope for the magnitudes $|i|_c$ and $|i|_{c+1}$ is within the pre-defined range from zero. Upon determining that the slope for the magnitudes $|i|_c$ and $|i|_{c+1}$ is within the pre-defined range from zero, the processor 205 reduces the difference $\Delta f$ between the values $f_c$ and $f_{c+1}$ compared to the difference $\Delta f$ between the values $f_{m-1}$ and $f_m$ or the values $f_{m+1}$ and $f_m$.

In some embodiments, the processor 205 stores within the memory device 207, all values of the operating frequency fRF and all magnitudes of the complex current of the sinusoidal current waveform at the output of the half-bridge circuit. The processor 205 accesses the values of the operating frequency fRF from the memory device 207 to control the signal generator 114 to operate at the operating frequency fRF.

It should be noted that in some embodiments, an example of the approximate maximum magnitude is a magnitude of the complex current that is the maximum magnitude $|i|_{max}$ among all magnitudes of the complex current measured for the operating frequency values, such as the values $f_{n-1}$, $f_n$, $f_{n+1}$, $f_{c-1}$, $f_c$, $f_{c+1}$, $f_{m-1}$, $f_m$, and $f_{m+1}$. Another example of the approximate maximum magnitude is a magnitude of the complex current that is not the maximum magnitude but is within a pre-defined limit from the maximum magnitude $|i|_{max}$. The pre-defined limit is stored in the memory device 207 and is accessed by the processor 205. To illustrate, the approximate maximum magnitude is a magnitude of the complex current that is within the pre-defined limit from the maximum magnitude $|i|_{max}$ at which a slope of the graph 300 is zero. In various embodiments, the pre-defined limit is less than a difference between the magnitudes $|i|_{c+1}$ and $|i|_c$ or a difference between the magnitudes $|i|_c$ and $|i|_{c-1}$.

Figure 5A:
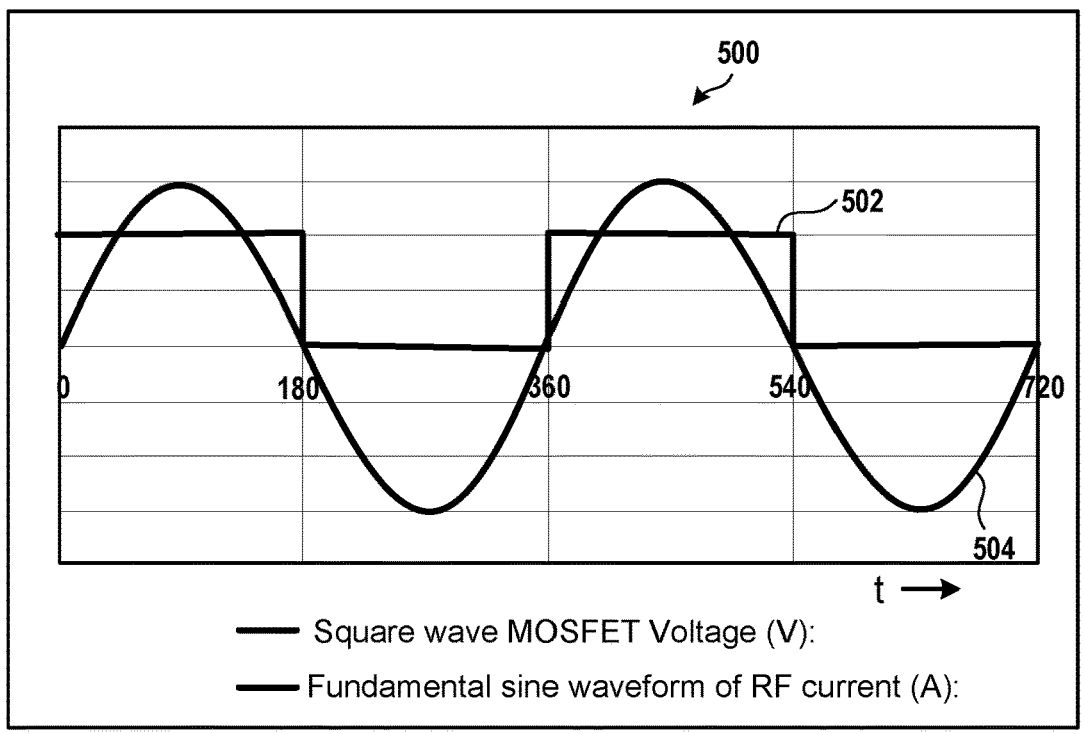
FIG. 5A is an embodiment of a graph to illustrate that a voltage waveform at the output of the half-bridge circuit is in phase with a fundamental waveform of a current signal at the output of the half-bridge circuit to maximize power that is provided to an electrode.

FIG. 5A is an embodiment of a graph 500 to illustrate that a voltage waveform 502 at the output of the half-bridge circuit is in phase with a fundamental waveform 504 of a current signal at the output of the half-bridge circuit to maximize power that is provided to the electrode 122 (FIG. 1). The graph 500 plots the voltage waveform 502 and the fundamental waveform 504 versus time t. The voltage waveform 502 represents voltage values of the sinusoidal current waveform at the output of the half-bridge circuit. Moreover, the fundamental waveform 504 represents magnitudes of the complex current of the sinusoidal current waveform at the output of the half-bridge circuit. It should be noted that when the voltage waveform 502 is in phase with the fundamental waveform 504, an approximate maximum amount of power is being supplied to the electrode 122.

In some embodiments, the VI probe is coupled to the output of the half-bridge circuit to measure the voltage values of the voltage waveform 502 and values of the current signal at the output of the half-bridge circuit. The VI probe measures a phase difference between the voltage waveform 502 and the fundamental waveform 504, and sends the phase difference to a processor (not shown). The processor (not shown) determines whether the voltage waveform 502 is in phase with the fundamental waveform 504. For example, the processor (not shown) determines whether the phase difference is substantially zero, such as zero or within a pre-set range from zero. The processor (not shown) changes the operating frequency fRF until the phase difference is substantially zero. No such VI probe is used in the system 100 of FIG. 1 and in the system 200 of FIG. 2. For example, the VI probe is not coupled to the output of the half-bridge circuit or between the output and the reactive circuit 130. Rather the current probe 110 is used to measure a magnitude of the complex current of the sinusoidal current waveform at the output of the half-bridge circuit.

Figure 5B:
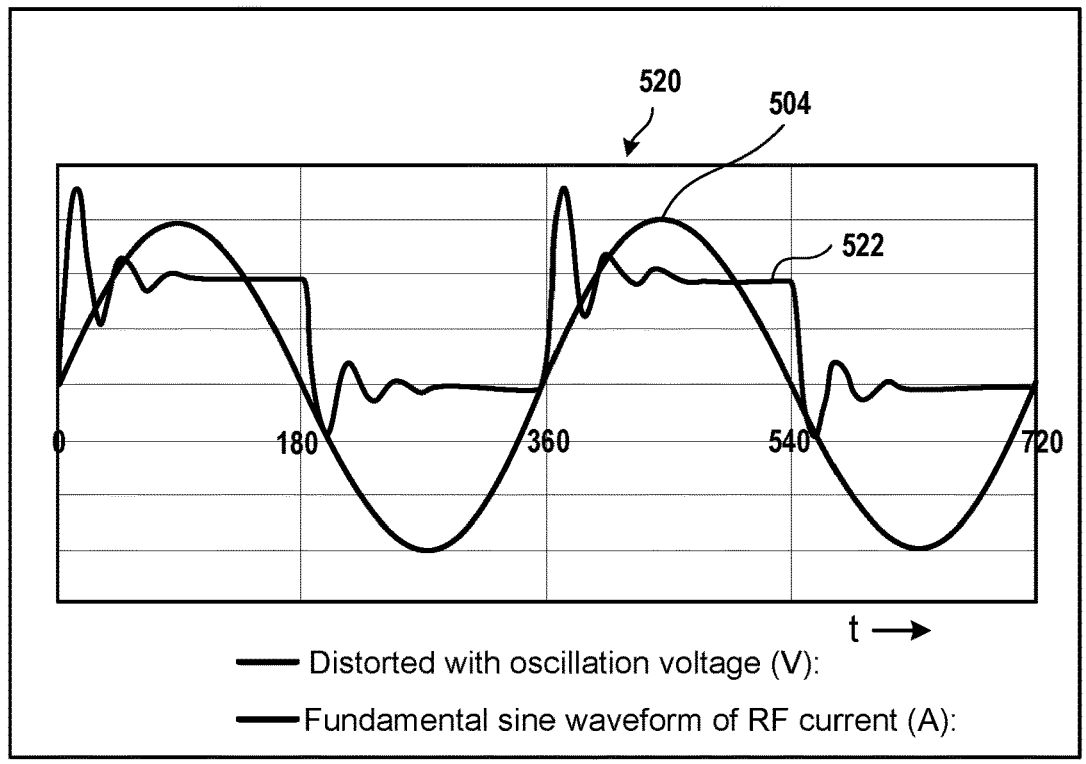
FIG. 5B is an embodiment of a graph to illustrate a difficulty in determining whether a phase difference between the voltage waveform and the fundamental waveform is substantially zero.

FIG. 5B is an embodiment of a graph 520 to illustrate a difficulty in determining whether the phase difference is substantially zero. The graph 520 plots a voltage signal 522 at the output of the half-bridge circuit and the fundamental waveform 504 versus the time t. As illustrated in FIG. 5B, the voltage signal 522 is not entirely square shaped. Rather, the voltage signal 522 has oscillations, such as ripples, during each transition of the voltage signal 522 from one state to another. An oscillation of the voltage signal 522 occurs immediately after a rising edge or a falling edge of the voltage signal 522. As such, it is difficult for the processor (not shown) to determine the operating frequency fRF for which the phase difference is substantially zero. The phase difference of substantially zero becomes a moving target to achieve due to the oscillations. Also, the oscillations change, such as increase or decrease, in their peak magnitude or in their number, with a change in a condition of a plasma chamber. Examples of the condition of the plasma chamber include a gap between an upper electrode and a lower electrode of the plasma chamber, a pressure within the plasma chamber, a temperature within the plasma chamber, a type of the process material used within the plasma chamber, or a combination of two or more thereof. Each time the condition of the plasma chamber changes, a setpoint, such as the operating frequency fRF, is manually adjusted to achieve the phase difference of substantially zero. There are errors in the manual adjustment. The change in the oscillations makes it more difficult to achieve the phase difference of zero. Comparatively, the processor 205 (FIG. 2) determines a value of the operating frequency fRF for which a magnitude of the complex current of the sinusoidal current waveform at the output of the half-bridge circuit is the approximate maximum. Instead of tuning the operating frequency fRF to achieve phase difference of substantially zero, the operating frequency fRF is tuned to achieve the approximate maximum magnitude of the complex current at the output of the half-bridge circuit. When the approximate maximum magnitude is achieved for a voltage of the voltage source Vdc, the operating frequency fRF of the signal generator 114 (FIG. 1) is tuned.

In some embodiments, the operating frequency fRF for which the approximate maximum magnitude is achieved is the same regardless of the change in the condition of the plasma chamber 217 (FIG. 1). For example, when the pressure within the plasma chamber 217 changes from a first level to another level, the operating frequency RF for which the approximate maximum magnitude is achieved is $f_c$. As another example, when the temperature within the plasma chamber 217 (FIG. 2) changes from a first level to another level, the operating frequency RF for which the approximate maximum magnitude is achieved is $f_c$. As such, there is no need to measure a magnitude of the complex current at the output of the half-bridge circuit when there is a change in the condition of the plasma chamber 217. Moreover, there is no need to determine whether the magnitude of the complex current at the output of the half-bridge circuit is at the approximate maximum when there is a change in the condition of the plasma chamber 217.

It should be noted that in some embodiments, the terms "is not greater than" is sometimes referred to herein as is less than or is equal to, and these terms are used interchangeably herein.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller, e.g., the host system, etc. is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, and any other semiconductor processing chamber that is associated or used in fabrication and/or manufacturing of semiconductor wafers.

It is further noted that although the above-described operations are described with reference to a transformer coupled plasma (TCP) reactor, in some embodiments, the above-described operations apply to other types of plasma chambers, e.g., conductor tools, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for optimizing power output of a matchless plasma source including a signal generator, comprising:
controlling the signal generator to operate at an operating frequency to generate a pulsed signal that is used to produce a sinusoidal current waveform;
measuring a magnitude of current of the sinusoidal current waveform;
adjusting the operating frequency of the signal generator while continuing to measure the magnitude of current; and
identifying a target frequency that maximizes the current during the adjusting.

2. The method of claim 1, wherein the target frequency is for operation of the signal generator.

3. The method of claim 1, wherein said adjusting the operating frequency includes incrementing the operating frequency by a pre-determined increment amount until the magnitude of current starts decreasing.

4. The method of claim 1, wherein said adjusting the operating frequency includes decrementing the operating frequency by a pre-determined decrement amount until the magnitude of current starts decreasing.

5. The method of claim 1, wherein the magnitude of current is measured at an output of an amplification circuit, wherein the amplification circuit is coupled to a gate driver circuit, wherein the gate driver circuit is coupled to the signal generator.

6. The method of claim 1, wherein said measuring the magnitude of current is not performed by a voltage and current sensor or by a voltage sensor.

7. The method of claim 1, wherein the current is maximized when an approximate maximum magnitude of the current is achieved, wherein the approximate maximum magnitude is a maximum value among all values of current for which the operating frequency is adjusted.

8. The method of claim 1, further comprising continuing to control the signal generator to operate at the target frequency independent of a change in a condition of a plasma chamber.

9. The method of claim 1, wherein said adjusting the operating frequency comprises:
increasing the operating frequency;
determining whether there is an increase in the current with the increase in the operating frequency;
continuing to further increase the operating frequency upon determining that the current increases with the increase in the operating frequency until the current starts decreasing; and
decreasing the operating frequency by a pre-determined amount when the current starts decreasing, wherein said decreasing the operating frequency by the pre-determined amount is performed to determine the target frequency.

10. The method of claim 1, wherein said adjusting the operating frequency comprises:
decreasing the operating frequency;
determining whether there is an increase in the current with the decrease in the operating frequency;
continuing to further decrease the operating frequency upon determining that the current increases with the decrease in the operating frequency until the current starts decreasing; and
increasing the operating frequency by a pre-determined amount when the current starts decreasing, wherein said increasing the operating frequency by the pre-determined amount is performed to determine the target frequency.

11. The method of claim 1, further comprising shaping an envelope of the sinusoidal current waveform.

12. The method of claim 1, further comprising removing harmonic frequencies of the sinusoidal current waveform to obtain a fundamental frequency of the sinusoidal current waveform.

13. The method of claim 1, wherein the signal generator is a digital clock signal generator.

14. The method of claim 1, wherein the matchless plasma source is coupled via a reactive circuit to a plasma chamber, wherein there is a lack of an impedance matching circuit between the matchless plasma source and the plasma chamber.

15. The method of claim 1, wherein the current is maximized when an approximate maximum magnitude of the current is achieved.

* * * * *